United States Patent
Lim

(10) Patent No.: US 6,816,230 B2
(45) Date of Patent: Nov. 9, 2004

(54) EXPOSURE CONTROL APPARATUS IN A LITHOGRAPHY SYSTEM AND METHOD THEREOF

(75) Inventor: Jong-Kill Lim, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 16 days.

(21) Appl. No.: 10/021,608

(22) Filed: Dec. 11, 2001

(65) Prior Publication Data

US 2002/0089652 A1 Jul. 11, 2002

(30) Foreign Application Priority Data

Jan. 10, 2001 (KR) .......................................... 2001-1255

(51) Int. Cl.[7] .......................... G03B 27/32; G03B 27/72
(52) U.S. Cl. .......................................... 355/27; 355/69
(58) Field of Search ........................ 355/27, 53, 69–71; 396/611; 118/52

(56) References Cited

U.S. PATENT DOCUMENTS

| 5,097,291 A | | 3/1992 | Suzuki ......................... 355/69 |
| 5,693,439 A | | 12/1997 | Tanaka et al. ................. 430/30 |
| 6,051,349 A | * | 4/2000 | Yoshioka et al. .............. 430/30 |
| 6,424,417 B1 | * | 7/2002 | Cohen et al. ................ 356/388 |

* cited by examiner

*Primary Examiner*—Henry Hung Nguyen
(74) *Attorney, Agent, or Firm*—Marger Johnson & McCollom, P.C.

(57) ABSTRACT

There is disclosed an exposure control method in a lithography system having a resist coating and developing apparatus, a wafer transferring mechanism and an exposure control apparatus. The exposure control method in the lithography system includes the steps of transmitting data of temperature for heat-treating a resist film in the resist coating and developing apparatus to the exposure control apparatus; determining and controlling exposure time based on the temperature data; and exposing the resist film on a wafer which is moved or transferred by the wafer transferring mechanism during the determined exposure time.

11 Claims, 4 Drawing Sheets

EXPOSURE CONTROL APPARATUS IN A LITHOGRAPHY SYSTEM AND METHOD THEREOF

BACKGROUND OF THE INVENTION

1. Field of the Invention

The present invention relates to a semiconductor device fabricating equipment, and more particularly to an exposure control apparatus and an exposure control method in a lithography system.

2. Description of the Related Art

Generally, a semiconductor device of integrated circuit is fabricated by a series of repeated and selected processes such as photography, etching, diffusion, metal deposition, etc. on a wafer. In order to form device patterns designated on semiconductor wafers that are used in preparing large quantities of semiconductor devices of integrated circuits, the photolithography process for exposing photoresist patterns on a wafer is widely applied from the early days of semiconductor fabrication because the photolithography process has many advantages such as, for instance, low cost, simple manufacturing process, etc.

The commonly used photolithography process is performed according to the following steps:

The step of coating a wafer cleaned in a HMDS process with photoresist is first carried out by a resist coating apparatus called a "spinner". The resist film coated on the wafer is heat-treated through a soft bake process for the stabilization of the resist film. After the soft bake process, the stabilized resist film is exposed with an exposure device such as "stepper" for a predetermined time, thereafter being heat-treated in a post-exposure bake process. The resist film then is developed by a developing device. Next the resist film is heat-treated in a hard bake process.

After the hard bake process, the wafer is moved to an etching station and etched by using the developed resist pattern as an etching mask.

The exposure time and the variance in temperature in the hard bake and post bake processes have been confirmed as the most likely factors affecting the quality of the device patterns. That is, in order to achieve a preferred critical dimension (CD), it is necessary to control effectively the exposure time and the bake temperature. Referring to the graphs in FIGS. 4 and 5, the importance of controlling the exposure time and the bake temperature will become clear.

FIG. 4 is a graph showing the changes in line widths relative to thickness of resist films and exposure time. This graph as an example shows how much the line width can be changed in the functional relationship of thickness of the resist film. The graph shows the result that only the pre-bake is performed at the temperature of about 90° C. during 30 minutes without performing a post bake. It has been found that a change of 20% in the resist's thickness corresponds to a change of 0.25 mm in its width. That is, if the resist thickness changes by 20%, the line width in process changes by 0.25 mm.

FIG. 5 shows a profile of various bake methods. It may be seen that soft baking by a hot plate has an advantage compared with other methods. Recently, prior to performing the exposure process in an in line system, a cold plate tends to be used to cool the wafer after baking the wafer by a hot plate.

In the past, a series of processes are performed by a user's manipulations as follows: measuring the bake temperature and the deviation of the temperature, manipulating the stepper's exposure time (as an instance, 0.2 seconds extended if change of 10 nm), confirming the pattern size after performing the process, etc. At that time, if the bake temperature is not uniform, the critical dimension is also bad thereby causing problems in the quality. Accordingly, the user has to manipulate the exposure time every time. And, it is not desirable that a user passively manipulates the exposure time whenever a deviation in temperature has occurred because highly integrated circuit devices require minimized and accurate sizes in their patterns.

As a result, there remains a need for an improved technique by which the exposure time can be automatically actively controlled in response to the change in the bake temperature as the critical dimension is affected even by a minute change in the bake temperature.

SUMMARY OF THE INVENTION

Accordingly, it is an object of the present invention to provide an exposure control apparatus and an exposure control method in a lithography system that is appropriate to the formation of a highly integrated semiconductor device pattern.

It is another object of the present invention to provide an exposure control apparatus and an exposure control method in a lithography system by which an exposure time is automatically and actively controlled in response to a change in temperature at which a resist is baked.

It is still another object of the present invention to provide an exposure control apparatus and an exposure control method in a lithography system wherein the exposure time is automatically controlled by a stepper responsive to bake temperature data obtained from a spinner in which the baking process is performed.

It is yet another object of the present invention to provide an exposure control apparatus by which an exposure time is automatically controlled and developing is accurately performed in order to achieve an accurate critical dimension for pattern on a wafer can be realized.

It is a further object of the present invention to minimize the incidence of failure in a photolithography process thereby stabilizing processes and improving yield in fabricating a semiconductor device.

In order to achieve the objects, according to a first aspect of the present invention, the exposure control method, in a lithography system including a resist coating and developing apparatus, a wafer transferring mechanism and an exposure control apparatus, comprises the steps of:

transmitting to the exposure control apparatus temperature data for heat-treating a resist film in the resist coating and developing apparatus;

determining a resist film exposure time responsive to the temperature data; and on a wafer which is transferred by the wafer transferring mechanism exposing the resist film the determined exposure time.

According to a second aspect of the present invention, the exposure control apparatus in a lithography system, including a resist coating and developing apparatus and a wafer transferring mechanism, comprises:

a receiver for receiving resist film heat treating temperature data from the resist coating and developing apparatus;

an optical system controller adapted to determine and control the resist film exposure time responsive to the resist film heating treating data.

According to the exposure control method and the exposure control apparatus in a lithography system as described above, the critical dimensions are achieved during the lithography process, thereby improving yield in fabricating a semiconductor device and stabilizing fabrication processes.

DETAILED DESCRIPTION OF THE PREFERRED EMBODIMENTS

Hereinafter, the exposure control method and exposure control apparatus in a lithography system will be explained with reference to the accompanying drawings.

Figure 1:
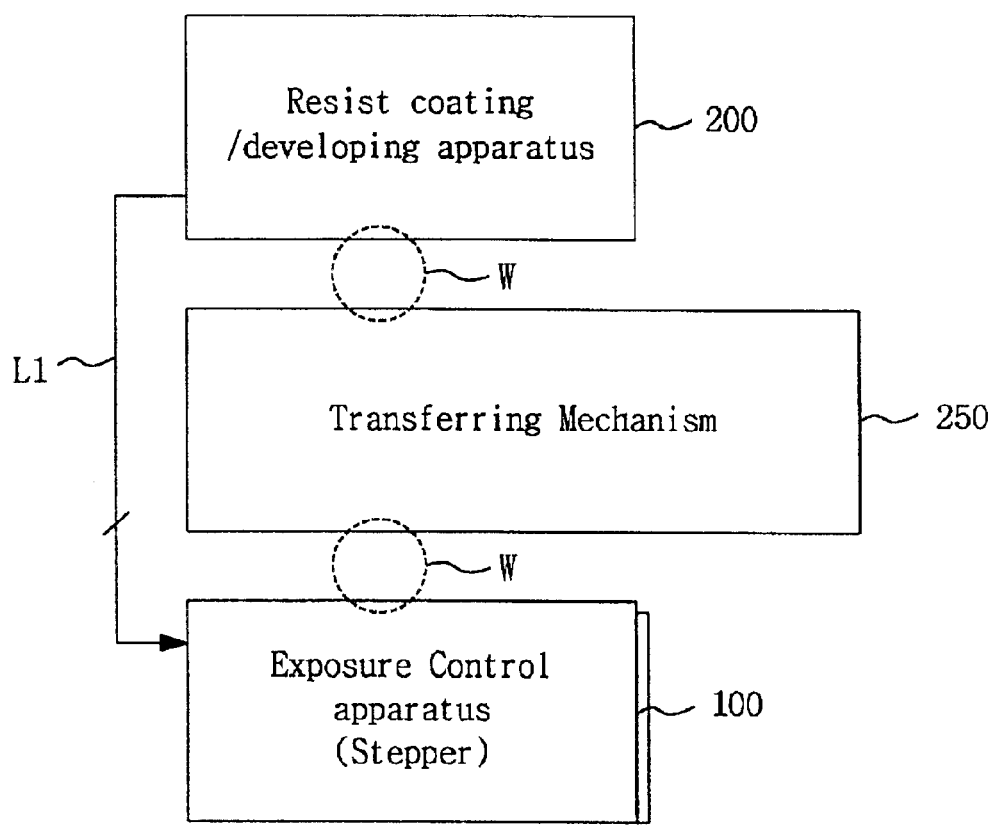
FIG. 1 is a block diagram of a lithography system of the present invention.

FIG. 1 is a block diagram illustrating the lithography system according to the preferred embodiment of the present invention. The system comprises a resist coating and developing apparatus 200, a wafer transferring mechanism 250, and an exposure control apparatus 100, which in a preferred embodiment is a stepper. The resist coating and developing apparatus 200 coats a wafer with a resist, and heats the resist and the wafer in a heating chamber. In addition, the resist coating and developing apparatus 200 develops the resist patterned by exposure to a light source.

The transferring mechanism 250 serves to transfer wafers W coated with the resist from the resist coating and developing apparatus 200 to the stepper 100. The exposure control apparatus 100 may be a DUB stepper in which an Eximer laser beam is used.

The wafers W coated with resist films by the resist coating and developing apparatus 200 are soft-baked, then are transferred to the stepper 100 by the transferring mechanism 250. The heat necessary for the soft bake is applied to the stepper 100 through the line L1. The stepper 100 receives and analyzes data for the soft bake temperature, post exposure bake temperature, and hard bake temperature to determine the appropriate exposure time, so that the exposed resist film is illuminated by a light source through a mask or reticle during the determined time. Thereby the resist film is patterned according to the patterns on a mask or reticle.

After the exposure process is complete, the wafers W are transferred to the resist coating and developing apparatus 200 by the transferring mechanism 250, then heat-treated in a post exposure bake process. The heat-treated resist film is developed by the developing apparatus and thereafter heat-treated in a bake process in the stepper 100. The post exposure bake temperature and hard bake temperature are applied to the stepper 100 through the line L1.

Hereinafter, the mechanism for determining the exposure time based on data of the bake temperature will be explained by reference to FIGS. 2 and 3.

Figure 2:
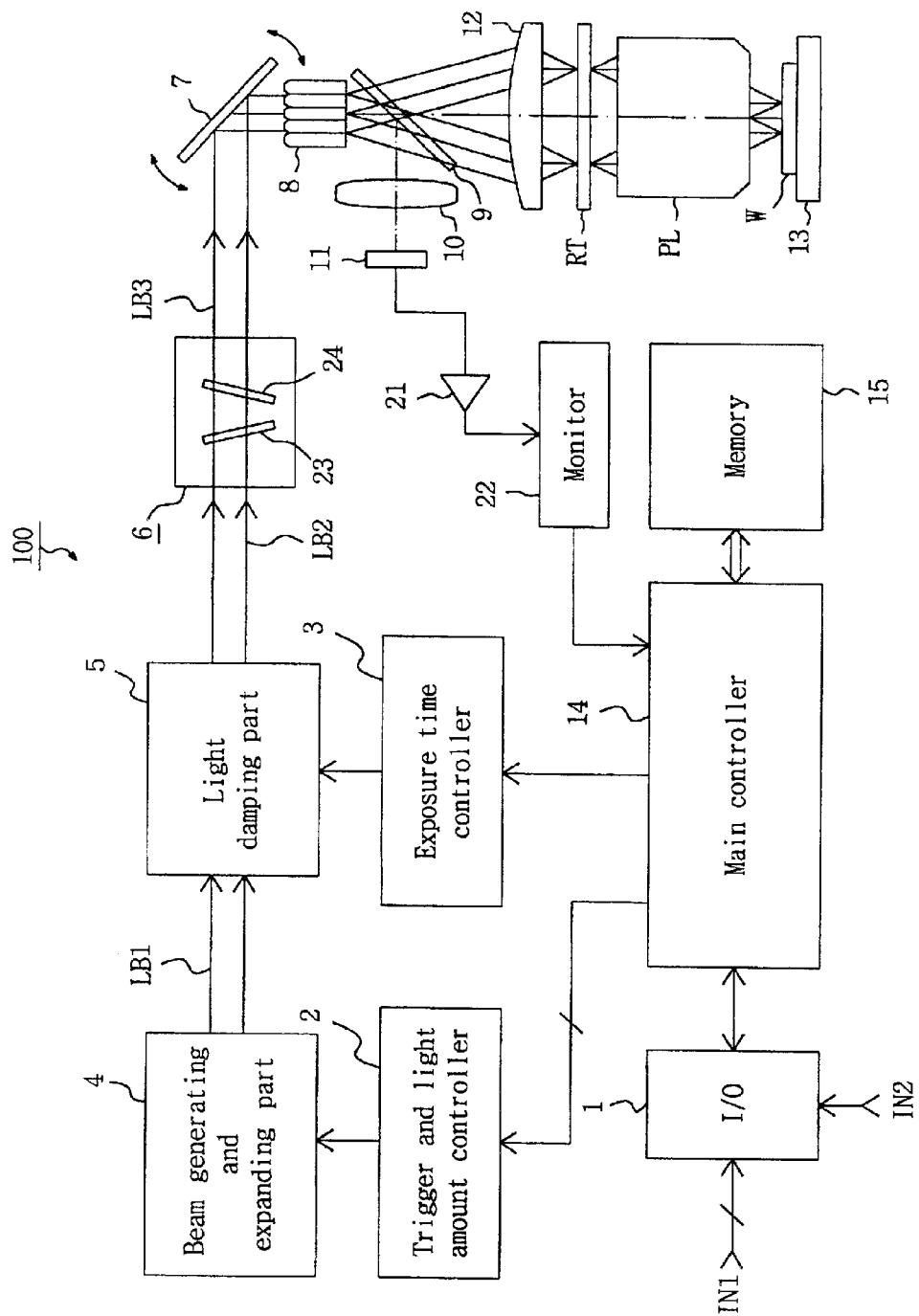
FIG. 2 is a detailed block diagram of the exposure control apparatus shown in FIG. 1.

FIG. 2 is a block diagram of the exposure control apparatus shown in FIG. 1. The exposure control apparatus comprises: an input/output part 1, a trigger and light amount controller 2, an exposure time controller 3, a beam generating and expanding part 4, a light damping part 5, a correcting and damping part 6, a mirror 7, a fly eye shaped mirror 8, a beam splitter 9, a lens 10, a light receiving part 11, a condenser lens 12, a reticle RT, a projection optical part PL, a wafer stage 13, a main controller 14, a memory 15, an amplifier 21, and a monitor 22. In the structure, the elements other than the input/output part 1, main controller 14, and memory 15 are included in an optical system.

Figure 3:
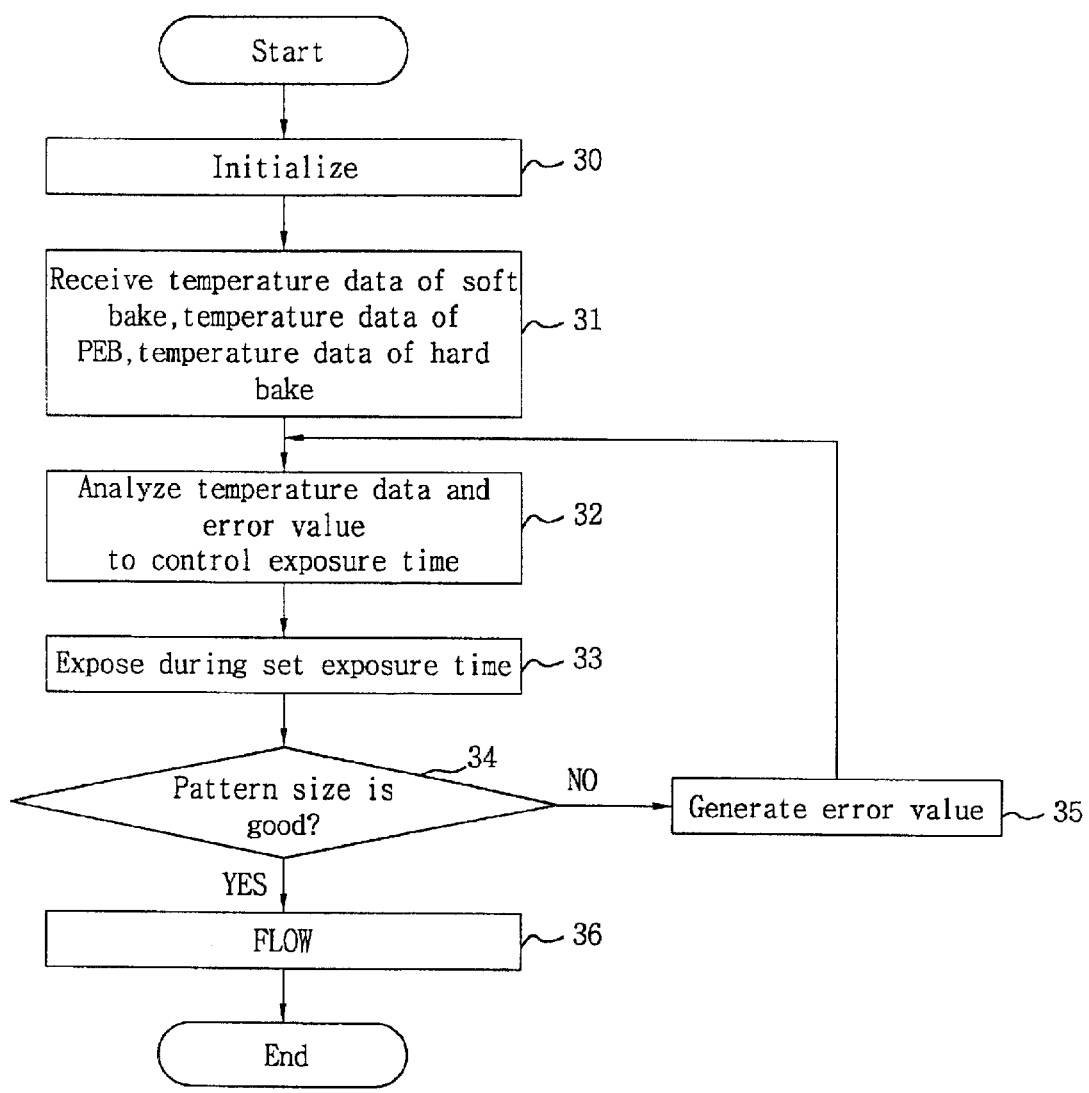
FIG. 3 is a flowchart illustrating control of exposure time in the exposure control apparatus shown in FIG. 2.
Figure 4:
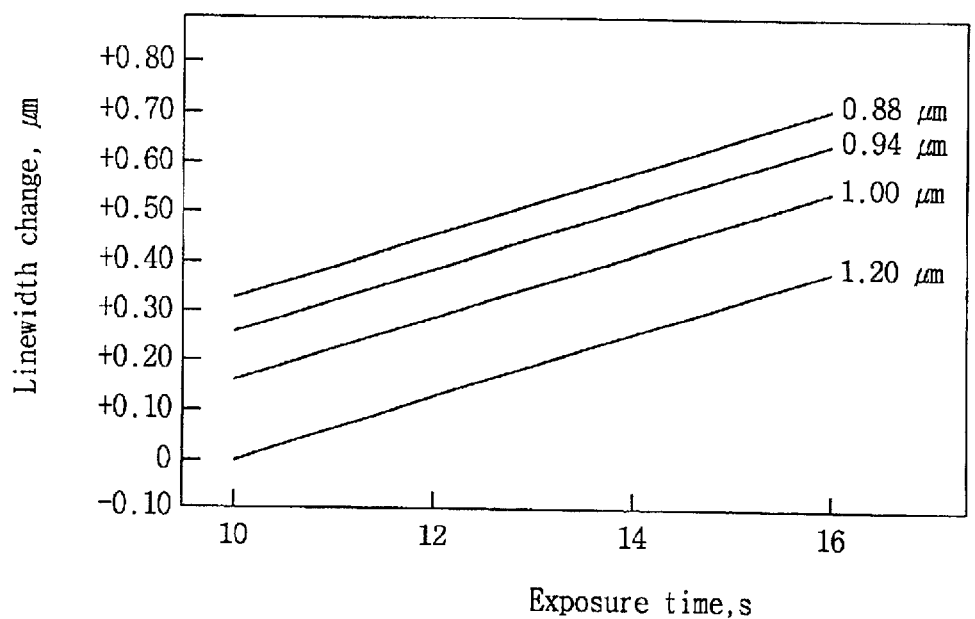
FIG. 4 is a graph showing the change in line width to exposure time.
Figure 5:
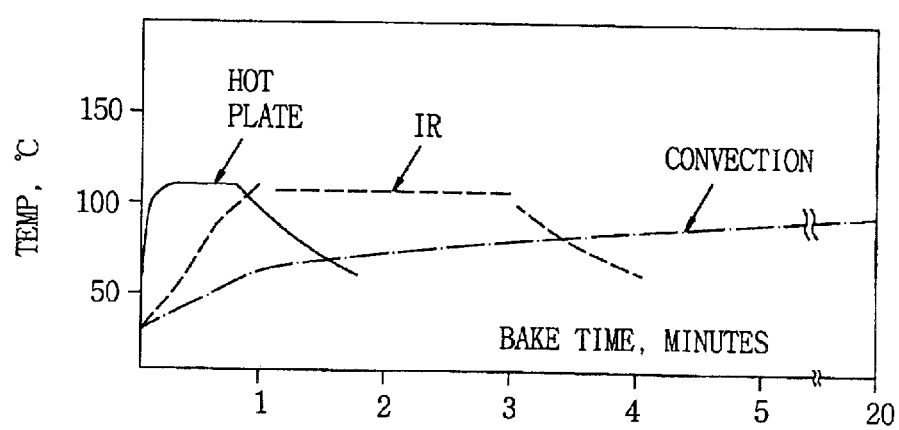
FIG. 5 is a graph showing various bake methods.

FIG. 3 is a flowchart illustrating the exposure time control in the exposure control apparatus shown in FIG. 2. The steps 30 to 36 are performed by the main control part 14 shown in FIG. 2.

The line L1 shown in FIG. 1 is connected to the first input terminal IN1 of the input/output part 1 of the exposure control apparatus 100 shown in FIG. 2. The command data and various input data provided by a user are input through the second input terminal. The temperature data of the soft bake of the resist, post exposure bake and hard bake are provided through the first input terminal IN1. The temperature data are provided from the temperature sensors (not shown) disposed in the resist coating and developing apparatus.

The various data inputted through the first input terminal IN1 and second input terminal IN2 of the input/output part 1 are transmitted to the main controller 14. The main controller 14 serves to receive the input data and control the operation of the exposure apparatus according to a program stored in the memory 15. The memory 15 stores the programmed data of FIG. 3 and control parameters for various computations and exposure operations. The main controller 14, which comprises a control apparatus such as a microprocessor, determines and controls an exposure time based on the temperature data, thereby controlling the optical system so that the resist on a wafer is illuminated by a light source for the determined exposure time.

Referring to FIG. 3, the main controller 14 performs an early state of operation at step 36 to set up each of the resists to an initial value on an early state, and receives the temperature data for the soft bake, post exposure bake and hard bake at step 31. If the wafer passed through only the early soft bake process, the main controller 14 receives only data of the soft bake temperature, and sets data of the post exposure bake and hard bake as early states of values.

Thereafter, if the post exposure bake and hard bake processes are performed, at that time the early states of values (initial values) are replaced with a practically measured temperature data. At step 32, the main controller 14 analyzes a temperature data and an error value to determine the exposure time. The finally determined exposure time data are transmitted to the exposure time controller 3. As a result, the exposure process is performed at step 33. The exposure time controller 3 outputs drive commands so that the light damping part 5 is operated based on the exposure time.

The data concerning whether the pattern size of the wafer W on the stage 13 is good or not are input to the second input terminal IN2. The main controller 14 proceeds to the flow process of step 36 if the pattern size is good, and generates an error value at step 35 to perform feedback at step 32 if the pattern size is bad. As a result, the exposure time value is renewed at step 32. That is, the feedback is performed because the exposure time of the stepper can be continuously manipulated at the time of loading. For example, if the pattern size has an error value of 10 nm using the same exposure time, the previously determined exposure time is changed by ±0.2 second.

The detailed explanation for the operation of the optical system shown in FIG. 2 is omitted because the operation mechanism is well known to a skilled person. If necessary, the U.S. Pat. Nos. 5,693,439 and 5,097,291 will provide information concerning the operation, and both are herein incorporated by reference as if fully set forth herein.

As described above, since the exposure time can be automatically controlled in response to the change in the bake temperature, the variation of the critical dimension caused by minute temperature deviation can be reduced.

In the foregoing, the description of the present invention is limited to the preferred embodiment only, but the present invention can be easily modified and changed within the scope of the spirit of the present invention. Such changes or modifications are included within the protective scope of claims of the present invention as claimed below. For example, adding or subtracting any other equivalent devices can change the detailed structure of the optical system in the exposure control apparatus, still within the spirit and scope of the invention.

According to the present invention as described above, the critical dimensions can be reliably achieved in the lithography process thereby improving yield in manufacturing.

What is claimed is:

1. An exposure control method in a lithography system having a resist coating and developing apparatus, a wafer transferring mechanism, and an exposure control apparatus, comprising:

transmitting temperature data of soft baking temperature, post baking temperature and hard baking temperature from the resist coating and developing apparatus to the exposure control apparatus, when baking processes are each performed;

determining a resist film exposure time responsive to the temperature data; and exposing the resist film to a light source for the determined resist film exposure time, wherein the resist film temperature data as initially calculated are replaced with practically measured temperature data when the baking processes are performed to adjust the exposure time.

2. The method as claimed in claim 1, wherein the resist film temperature data is provided from temperature sensors disposed in the resist coating and developing apparatus.

3. The method as claimed in claim 1, wherein the resist film temperature data is provided for a soft bake, a post exposure bake, and a hard bake of the resist film.

4. The method as claimed in claim 1, wherein determining the resist film exposure time comprises analyzing the received temperature data and an error value in a pattern size.

5. An exposure control apparatus in a lithography system having a resist coating and developing apparatus and a wafer transferring mechanism, comprising:

a receiver configured to receive temperature data of soft baking temperature, post baking temperature and hard baking temperature from the resist coating and developing apparatus, when baking processes are each performed;

an optical system configured to expose at least a portion of a resist film to a light source; and an optical system controller adapted to determine and control a resist film exposure time responsive to the temperature data received from the resist coating and developing apparatus, wherein the temperature data as initially calculated are replaced with practically measured temperature data when the baking processes are performed to adjust the exposure time.

6. The apparatus as claimed in claim 5, wherein the resist film heat treating temperature data is provided from temperature sensors disposed in the resist coating and developing apparatus.

7. The apparatus as claimed in claim 5, wherein the resist film heat treating temperature data is for a soft bake, a post exposure bake and a hard bake of the resist.

8. The apparatus as claimed in claim 5, wherein the optical system controller is further adapted to analyze the resist film heat treating temperature data and an error value in a pattern size.

9. A lithography system comprising:

a resist coating and developing apparatus including at least one resist film temperature sensor;

a wafer transferring mechanism; and an exposure control apparatus including a receiver configured to receive temperature data of soft baking temperature, post baking temperature and hard baking temperature from the resist coating and developing apparatus, when baking processes are each performed; an optical system configured to expose a resist film to a light source; and a controller configured to control the optical system and configured to determine and control a resist film exposure time responsive to the temperature data, wherein the temperature data as initially calculated are replaced with practically measured temperature data when the baking processes are performed to adjust the exposure time.

10. The system as claimed in claim 9, wherein the resist film temperature data is provided for a soft bake, a post exposure bake, and a hard bake of the resist.

11. The system as claimed in claim 9, wherein the controller is also configured to determine the resist film exposure time responsive to the received resist film temperature data and an error value in a pattern.

* * * * *